United States Patent
Liu

(10) Patent No.: US 9,847,808 B2
(45) Date of Patent: Dec. 19, 2017

(54) APPARATUS AND METHOD FOR INTERFERENCE CANCELLATION

(71) Applicant: HUAWEI TECHNOLOGIES CO., LTD., Shenzhen, Guangdong (CN)

(72) Inventor: Sheng Liu, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 15/263,885

(22) Filed: Sep. 13, 2016

(65) Prior Publication Data

US 2016/0380670 A1 Dec. 29, 2016

Related U.S. Application Data

(63) Continuation of application No. PCT/CN2014/073434, filed on Mar. 14, 2014.

(51) Int. Cl.
*H04B 1/38* (2015.01)
*H04B 1/525* (2015.01)
(Continued)

(52) U.S. Cl.
CPC ............ *H04B 1/525* (2013.01); *H01P 1/182* (2013.01); *H01P 1/213* (2013.01); *H01P 1/383* (2013.01);
(Continued)

(58) Field of Classification Search
CPC .......... H04B 1/525; H04B 15/00; H04B 1/38; H04B 1/44; H04B 1/0096; H04B 1/036;
(Continued)

(56) References Cited

U.S. PATENT DOCUMENTS

2007/0207747 A1* 9/2007 Johnson ............... H04B 1/52
  455/78
2014/0328222 A1 11/2014 Mao et al.

FOREIGN PATENT DOCUMENTS

| CN | 101154959 | 4/2008 |
| CN | 102571655 | 7/2012 |
| CN | 103580720 | 2/2014 |

OTHER PUBLICATIONS

International Search Report dated Nov. 26, 2014 in corresponding International Application No. PCT/CN2014/073434.
(Continued)

*Primary Examiner* — Ajibola Akinyemi
(74) *Attorney, Agent, or Firm* — Staas & Halsey LLP

(57) ABSTRACT

Embodiments of the present invention provide an apparatus and a method for interference cancellation. The apparatus includes: a splitter, configured to acquire a first transmit signal and a second transmit signal; a first circulator, configured to transmit the first transmit signal to an antenna and to send a to-be-processed signal to a combiner, where the to-be-processed signal includes a receive signal component and a self-interference signal component, the self-interference signal component corresponds to an interference signal generated due to that the antenna reflects the first transmit signal; a second circulator, configured to: transmit the second transmit signal to an equivalent load, and acquire a reference signal generated due to that the equivalent load reflects the second transmit signal, where an impedance of the equivalent load corresponds to an impedance of the antenna; and a combiner, configured to cancel the self-interference signal component according to the reference signal.

12 Claims, 3 Drawing Sheets

(51) Int. Cl.
*H01P 1/213* (2006.01)
*H03H 7/46* (2006.01)
*H01P 1/18* (2006.01)
*H01P 1/383* (2006.01)
*H01P 5/12* (2006.01)
*H03H 7/48* (2006.01)

(52) U.S. Cl.
CPC .............. *H01P 5/12* (2013.01); *H03H 7/46* (2013.01); *H03H 7/48* (2013.01)

(58) Field of Classification Search
CPC ...... H04B 1/04; H04B 1/0458; H04B 1/0475; H04B 1/126; H04B 1/18; H04B 1/56; H04B 2001/0425; H04B 7/0617; H04B 7/0671; H04B 10/25759; H04B 1/005
USPC .......................................................... 455/73
See application file for complete search history.

(56) References Cited

OTHER PUBLICATIONS

International Search Report, dated Mar. 14, 2017, in corresponding International Patent Application No. PCT/CN2014/073434.
Written Opinion of the International Searching Authority dated Mar. 14, 2017, in corresponding International Patent Application No. PCT/CN2014/073434.

\* cited by examiner

APPARATUS AND METHOD FOR INTERFERENCE CANCELLATION

CROSS-REFERENCE TO RELATED APPLICATIONS

This application is a continuation of International Application No. PCT/CN2014/073434, filed on Mar. 14, 2014, which is hereby incorporated by reference in its entirety.

TECHNICAL FIELD

Embodiments of the present invention relate to the field of communications technologies, and more specifically, to an apparatus and a method for interference cancellation.

BACKGROUND

In a wireless communications system such as a mobile cellular communications system, a wireless local area network (WLAN), or a fixed wireless access (FWA) system, communication nodes such as a base station (BS) or an access point (AP), a relay station (RS), and user equipment (UE) generally have a capability of transmitting their signals and receiving a signal from another communication node. Because attenuation of a radio signal in a radio channel is quite large, compared with a transmit signal of a local end, a signal from a communication peer end is quite weak when the signal reaches a receive end. For example, in a mobile cellular communications system, a difference of power between a receive signal and a transmit signal of a communication node reaches 80 dB to 140 dB or even larger. Therefore, to avoid self-interference imposed by a transmit signal on a receive signal of a same transceiver, transmitting and receiving of a radio signal generally use different frequency divisions or time divisions for differentiation. For example, in frequency division duplex (FDD), different frequency divisions separated by a particular guard band are used for receiving and transmitting to perform communication; in time division duplex (TDD), different time divisions separated by a particular guard interval are used for receiving and transmitting to perform communication. Both the guard band in the FDD system and the guard interval in the FDD system are used to ensure sufficient isolation between receiving and transmitting, and avoid interference imposed by transmitting on receiving.

Unlike an existing FDD or TDD technology, a wireless full-duplex technology can perform receiving and transmitting operations on a same radio channel at the same time; in this way, spectrum efficiency of the wireless full-duplex technology is theoretically two times of that of the FDD or TDD technology. Apparently, a precondition for implementing wireless full-duplex is avoiding, reducing, and canceling, as much as possible, strong interference (referred to as self-interference) imposed by a transmit signal on a receive signal, so that the self-interference does not affect correct receiving of a wanted signal.

In addition, to improve antenna utilization, a technology of receiving and transmitting via a same antenna is proposed.

When receiving and transmitting use a same antenna, a device such as a circulator is generally used to isolate a transmit end from a receive end. When a voltage standing wave ratio (VSWR) of the antenna is relatively small, for example, VSWR<1.2, receive and transmit isolation of 20 dB to 25 dB may be obtained by using the circulator.

When a channel bandwidth is relatively large (typically, when a bandwidth of a frequency band of 2 GHz to 3 GHz is greater than 10 MHz), an antenna impedance mismatch is relatively large, that is, a resistance component and a reactance component in the antenna impedance change with a frequency change, so that a VSWR change is relatively large. For example, on a frequency band of 2.4 GHz to 2.5 GHz, a VSWR of a wireless fidelity (WiFi) antenna generally changes within a range from 1.4 to 2.0. In this way, a self-interference signal that enters a receive end due to reflection by an antenna port is no longer a simple duplicate of a transmit signal with a different amplitude and delay (or phase), it is difficult to effectively cancel a self-interference signal component that enters the receive end due to reflection by the antenna port, and an effect of interference cancellation is severely affected.

Therefore, it is expected to provide a technology that can improve an effect of interference cancellation.

SUMMARY

Embodiments of the present invention provide an apparatus and a method for interference cancellation, which can improve an effect of interference cancellation.

According to a first aspect, an apparatus for self-interference cancellation is provided, where the apparatus includes: a splitter 110, a first circulator 120, an antenna 130, a second circulator 140, an equivalent load 150, and a combiner 160, where a first output end 112 of the splitter 110 is connected to a first port 122 of the first circulator 120, a second port 124 of the first circulator 120 is connected to the antenna 130, a third port 126 of the first circulator 120 is connected to a first input port 162 of the combiner 160, a second output end 114 of the splitter 110 is connected to a first port 142 of the second circulator 140, a second port 144 of the second circulator 140 is connected to the equivalent load 150, a third port 146 of the second circulator 140 is connected to a second input port 164 of the combiner 160, and an impedance of the equivalent load 150 corresponds to an impedance of the antenna 130, where the splitter 110 is configured to perform splitting processing on a radio-frequency signal to acquire a first transmit signal and a second transmit signal, transmit the first transmit signal to the first port 122 of the first circulator 120, and transmit the second transmit signal to the first port 142 of the second circulator 140; the first circulator 120 is configured to transmit the first transmit signal through the second port 124 to the antenna 130; the antenna 130 is configured to transmit the first transmit signal, perform receiving processing to acquire a receive signal, and transmit the receive signal to the second port 124 of the first circulator 120, where the first circulator 120 is further configured to send a to-be-processed signal through the third port 126 to the combiner 160, where the to-be-processed signal includes a receive signal component and a self-interference signal component, the receive signal component corresponds to the receive signal, and the self-interference signal component corresponds to an interference signal generated due to that the antenna 130 reflects the first transmit signal; the second circulator 140 is configured to: transmit the second transmit signal through the second port 144 to the equivalent load 150, and acquire, through the third port 146, a reference signal generated due to that the equivalent load 150 reflects the second transmit signal, where an impedance of the equivalent load 150 corresponds to an impedance of the antenna 130; and the combiner 160 is configured to cancel the self-interference signal component in the to-be-processed signal according to the reference signal.

In an implementation manner of the first aspect, the splitter 110 is configured to perform splitting processing on a radio-frequency signal to acquire a first transmit signal and a second transmit signal, where a phase of the first transmit signal is the same as or approximately the same as a phase of the second transmit signal; and the combiner 160 is specifically configured to: perform phase inversion processing on the reference signal, so that a phase of the reference signal changes by 180° or approximately changes by 180°; and combine the reference signal obtained after the phase inversion processing with the to-be-processed signal; or the combiner 160 is specifically configured to: perform phase inversion processing on the to-be-processed signal, so that a phase of the to-be-processed signal changes by 180° or approximately changes by 180°; and combine the to-be-processed signal obtained after the phase inversion processing with the reference signal.

With reference to the first aspect and any implementation manner of the foregoing implementations manners, in another implementation manner of the first aspect, the splitter 110 is configured to perform splitting processing on a radio-frequency signal to acquire a first transmit signal and a second transmit signal, where a phase of the first transmit signal is the same as or approximately the same as a phase of the second transmit signal; and the apparatus further includes: a phase changer, where the phase changer is disposed between the splitter 110 and the first circulator 120, and is configured to perform phase inversion processing on the first transmit signal, so that the phase of the first transmit signal changes by 180° or approximately changes by 180°; or the phase changer is disposed between the splitter 110 and the second circulator 140, and is configured to perform phase inversion processing on the second transmit signal, so that the phase of the second transmit signal changes by 180° or approximately changes by 180°; or the phase changer is disposed between the first circulator 120 and the combiner 160, and is configured to perform phase inversion processing on the to-be-processed signal, so that a phase of the to-be-processed signal changes by 180° or approximately changes by 180°; or the phase changer is disposed between the second circulator 140 and the combiner 160, and is configured to perform phase inversion processing on the reference signal, so that a phase of the reference signal changes by 180° or approximately changes by 180°; and the combiner 160 is specifically configured to combine the to-be-processed signal with the reference signal.

With reference to the first aspect and any implementation manner of the foregoing implementation manners, in another implementation manner of the first aspect, the splitter 110 is configured to perform splitting processing on a radio-frequency signal to acquire a first transmit signal and a second transmit signal, where a difference between a phase of the first transmit signal and a phase of the second transmit signal is 180° or approximately 180°; and the combiner 160 is specifically configured to combine the to-be-processed signal with the reference signal.

With reference to the first aspect and any implementation manner of the foregoing implementation manners, in another implementation manner of the first aspect, the apparatus further includes: an amplitude and phase regulator 170, disposed between the second circulator 140 and the equivalent load 150, and configured to: regulate, based on the to-be-processed signal, an amplitude and the phase of the second transmit signal, so that an amplitude of the reference signal is opposite to or approximately opposite to an amplitude of the self-interference signal component, and the phase of the reference signal is the same as or approximately the same as a phase of the self-interference signal component; or regulate, based on the to-be-processed signal, an amplitude and the phase of the second transmit signal, so that an amplitude of the reference signal is the same as or approximately the same as an amplitude of the self-interference signal component, and a difference between the phase of the reference signal and a phase of the self-interference signal component is 180° or approximately 180°; and the combiner 160 is specifically configured to combine the to-be-processed signal with the reference signal.

According to a second aspect, a method for interference cancellation is provided, where the method includes: performing splitting processing on a radio-frequency signal to acquire a first transmit signal and a second transmit signal; transmitting the first transmit signal to an antenna; and transmitting the second transmit signal to an equivalent load, where an impedance of the equivalent load corresponds to an impedance of the antenna; acquiring a to-be-processed signal, where the to-be-processed signal includes a receive signal component and a self-interference signal component, the receive signal component corresponds to a receive signal received by the antenna, and the self-interference signal component corresponds to an interference signal generated due to that the antenna reflects the first transmit signal; acquiring a reference signal generated due to that the equivalent load reflects the second transmit signal; and canceling the interference signal component in the to-be-processed signal according to the reference signal.

In an implementation manner of the second aspect, a phase of the first transmit signal is the same as or approximately the same as a phase of the second transmit signal; and the canceling the self-interference signal component in the to-be-processed signal according to the reference signal includes: performing phase inversion processing on the reference signal, so that a phase of the reference signal changes by 180° or approximately changes by 180°, and combining the reference signal obtained after the phase inversion processing with the to-be-processed signal; or performing phase inversion processing on the to-be-processed signal, so that a phase of the to-be-processed signal changes by 180° or approximately changes by 180°, and combining the to-be-processed signal obtained after the phase inversion processing with the reference signal.

With reference to the second aspect and any implementation manner of the foregoing implementation manners, in another implementation manner of the first aspect, a phase of the first transmit signal is the same as or approximately the same as a phase of the second transmit signal; and the canceling the self-interference signal component in the to-be-processed signal according to the reference signal includes: performing phase inversion processing on the first transmit signal, so that the phase of the first transmit signal changes by 180° or approximately changes by 180°, and combining the to-be-processed signal with the reference signal; or performing phase inversion processing on the second transmit signal, so that the phase of the second transmit signal changes by 180° or approximately changes by 180°, and combining the to-be-processed signal with the reference signal.

With reference to the second aspect and any implementation manner of the foregoing implementation manners, in another implementation manner of the first aspect, a phase of the first transmit signal is opposite to or approximately opposite to a phase of the second transmit signal; and the canceling the self-interference signal component in the to-be-processed signal according to the reference signal includes: combining the to-be-processed signal with the reference signal.

With reference to the second aspect and any implementation manner of the foregoing implementation manners, in another implementation manner of the first aspect, the canceling the self-interference signal component in the to-be-processed signal according to the reference signal includes: regulating, based on the to-be-processed signal, an amplitude and the phase of the second transmit signal, so that an amplitude of the reference signal is opposite to or approximately opposite to an amplitude of the self-interference signal component, and the phase of the reference signal is the same as or approximately the same as a phase of the self-interference signal component; or regulating, based on the to-be-processed signal, an amplitude and the phase of the second transmit signal, so that an amplitude of the reference signal is the same as or approximately the same as an amplitude of the self-interference signal component, and a difference between the phase of the reference signal and a phase of the self-interference signal component is 180° or approximately 180°, and combining the to-be-processed signal with the reference signal.

According to the apparatus and the method for interference cancellation in the embodiments of the present invention, an equivalent load is disposed, so that an impedance of the equivalent load corresponds to an impedance of an antenna; and a reference signal can be obtained by using the equivalent load. In addition, the reference signal corresponds to a self-interference signal generated due to reflection by the antenna, so that a self-interference signal component that is in a receive signal and is generated due to reflection by the antenna can be effectively eliminated by using the reference signal, and an effect of interference cancellation can be improved.

BRIEF DESCRIPTION OF DRAWINGS

To describe the technical solutions in the embodiments of the present invention more clearly, the following briefly introduces the accompanying drawings required for describing the embodiments. Apparently, the accompanying drawings in the following description show merely some embodiments of the present invention, and a person of ordinary skill in the art may still derive other drawings from these accompanying drawings without creative efforts.

REFERENCE NUMERALS

Figure 1:
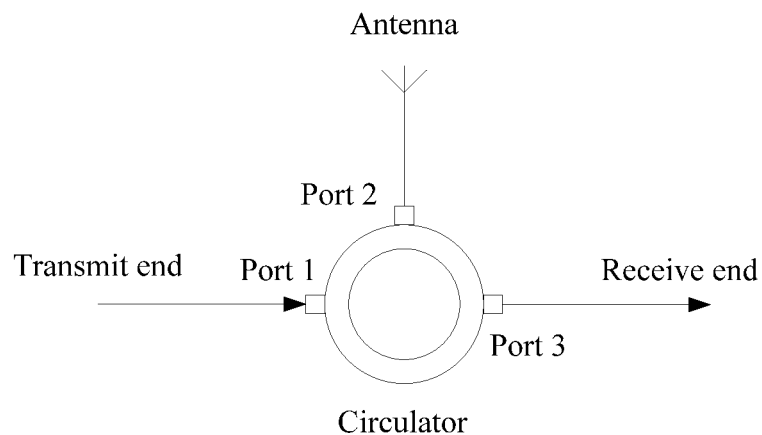
FIG. 1 is a schematic diagram representing a structure of a circulator.

110—Splitter
112—First output end of a splitter
114—Second output end of a splitter
120—First circulator
122—First port of a first circulator
124—Second port of a first circulator
126—Third port of a first circulator
130—Antenna
140—Second circulator
142—First port of a second circulator
144—Second port of a second circulator
146—Third port of a second circulator
150—Equivalent load
160—Combiner
170—Amplitude and phase regulator

DESCRIPTION OF EMBODIMENTS

Multiple embodiments are described now with reference to the accompanying drawings, where a same reference numeral is used to indicate a same component in this specification. In the following description, for ease of explanation, a large amount of details are provided so as to provide comprehensive understanding for one or more embodiments. However, apparently, the embodiments may be implemented without using these specific details. In another example, well-known structures and devices are shown in a form of a block diagram to help describe one or more embodiments.

The terms "component", "module", "system", and the like that are used in this specification are used to indicate an entity, hardware, firmware, a combination of hardware and software, software, or software in execution that is related to a computer. For example, a component may be but is not limited to a process running on a processor, a processor, an object, an executable file, an execution thread, a program, and/or a computer. As shown in a diagram, both an application running on a computing device and a computing device may be a component. One or more components may camp on a process and/or an execution thread, and components may be located on a computer and/or distributed among two or more computers. In addition, these components may be executed on various computer readable media on which various data structures are stored. Components may communicate, for example, according to a signal that has one or more data packets (for example, data of two components that interact with another component from a local system, a distributed system, and/or a network, and for example, the Internet that interacts with another system by using a signal), by using a local process and/or a remote process.

The apparatus for interference cancellation in the embodiments of the present invention may be disposed on or may be an access terminal that uses a wireless full-duplex technology. The access terminal may also be referred to as a system, a user unit, a user station, a mobile radio station, a mobile station, a remote station, a remote terminal, a mobile device, a user terminal, a terminal, a wireless communications device, a user agent, a user apparatus, or user equipment (UE). The access terminal may be a cellular phone, a cordless phone, a SIP (Session Initiation Protocol) phone, a WLL (Wireless Local Loop) station, a PDA (Personal Digital Assistant), a handheld device or a computing device with a radio communication function, or another processing device connected to a radio modem.

In addition, the apparatus for interference cancellation in the embodiments of the present invention may be disposed on or may be a base station that uses the wireless full-duplex technology. The base station can be configured to communicate with a mobile device; and the base station may be a WiFi AP (Access Point), a BTS (Base Transceiver Station) in a GSM (Global System for Mobile Communications) or CDMA (Code Division Multiple Access), may be an NB (NodeB) in WCDMA (Wideband Code Division Multiple Access), or may be an eNB or eNodeB (evolved NodeB) in LTE (Long Term Evolution), a relay station or an access point, a base station device in a future 5G network, or the like.

In addition, aspects or features of the present invention may be implemented as an apparatus or a product that uses standard programming and/or engineering technologies. The term "product" used in this application covers a computer program that can be accessed from any computer readable component, carrier, or medium. For example, the computer readable medium may include but is not limited to: a magnetic storage component (for example, a hard disk, a floppy disk, or a magnetic tape), an optical disc (for example, a CD (Compact Disk), a DVD (Digital Versatile Disk), a smart card and a flash memory component (for example, EPROM (Erasable Programmable Read-Only Memory), a card, stick, or key drive). In addition, various storage media described in this specification may indicate one or more devices used to store information and/or another machine readable medium. The term "machine readable media" may include but is not limited to a radio channel, and various other media that can store, contain and/or carry an instruction and/or data.

It should be noted that in the embodiments of the present invention, self-interference cancellation may refer to canceling all of a self-interference signal component in a receive signal, or may refer to canceling a part of a self-interference signal component in a receive signal. That is, the cancellation in the embodiments of the present invention may refer to full cancellation or partial cancellation.

The embodiments of the present invention may be used in a full-duplex system that implements, by using a circulator, receiving and transmitting via a same antenna. FIG. 1 shows a structure of a circulator that can be used in an apparatus for interference cancellation in the embodiments of the present invention. As shown in FIG. 1, a transmit end is connected to a port 1 of the circulator, an antenna is connected to a port 2 of the circulator, and a receive end is connected to a port 3 of the circulator. According to a characteristic of an ideal circulator, a signal of the port 1 may directly enter the port 2, and a signal of the port 2 may directly enter the port 3; however, the port 1 is isolated from the port 3, that is, the signal of the port 1 cannot directly enter the port 3.

However, because of a reflection effect of the antenna, a receive signal has a self-interference signal component that is reflected by an antenna port (that is, the port 2 of the circulator) and enters the receive end (that is, the port 3 of the circulator).

Figure 2:
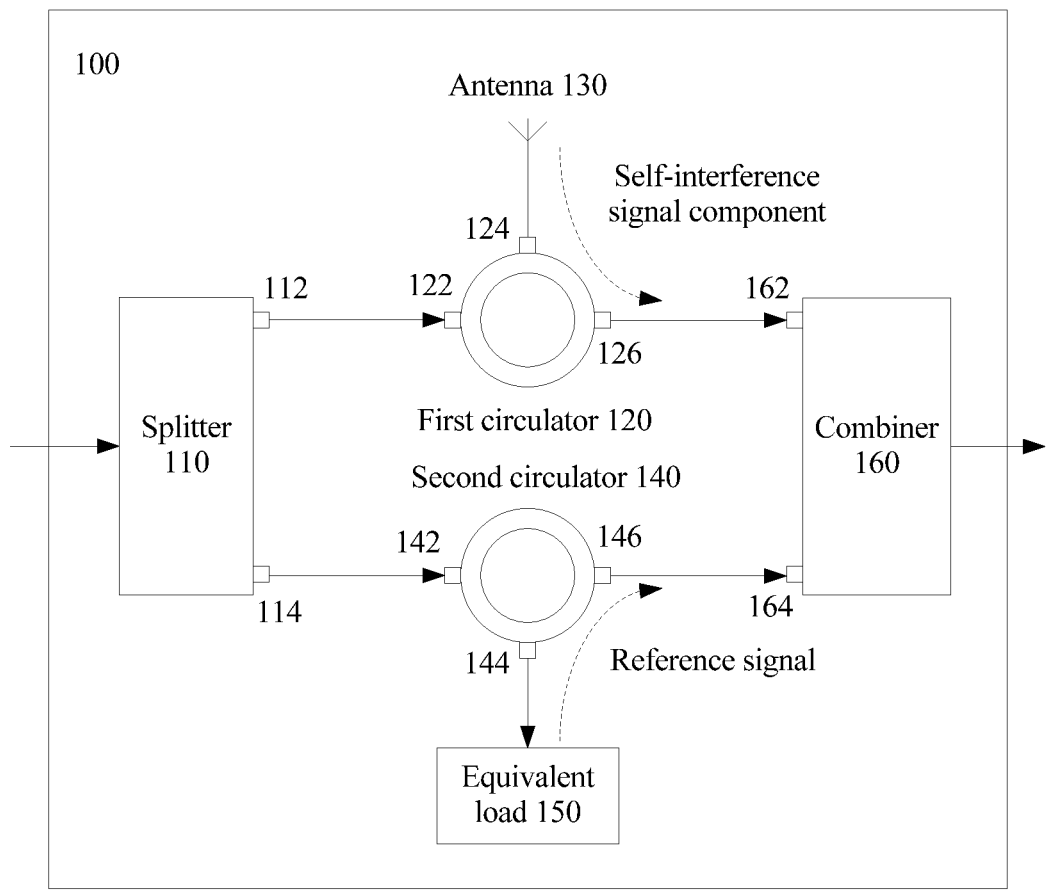
FIG. 2 is a schematic structural diagram of an apparatus for interference cancellation according to an embodiment of the present invention.

An embodiment of the present invention provides an apparatus for interference cancellation. FIG. 2 is a schematic structural diagram of an apparatus 100 for interference cancellation according to this embodiment of the present invention. As shown in FIG. 2, the apparatus 100 includes: a splitter 110, a first circulator 120, an antenna 130, a second circulator 140, an equivalent load 150, and a combiner 160, where a first output end 112 of the splitter 110 is connected to a first port 122 of the first circulator 120, a second port 124 of the first circulator 120 is connected to the antenna 130, a third port 126 of the first circulator 120 is connected to a first input port 162 of the combiner 160, a second output end 114 of the splitter 110 is connected to a first port 142 of the second circulator 140, a second port 144 of the second circulator 140 is connected to the equivalent load 150, a third port 146 of the second circulator 140 is connected to a second input port 164 of the combiner 160, and an impedance of the equivalent load 150 corresponds to an impedance of the antenna 130.

The splitter 110 is configured to: perform splitting processing on a radio-frequency signal to acquire a first transmit signal and a second transmit signal, transmit the first transmit signal to the first circulator 120, and transmit the second transmit signal to the second circulator 140.

The first circulator 120 is configured to transmit the first transmit signal through a second port 124 to the antenna 130.

The antenna 130 is configured to: transmit the first transmit signal, perform receiving processing to acquire a receive signal, and transmit the receive signal to the second port 124 of the first circulator 120.

The first circulator 120 is further configured to send a to-be-processed signal through the third port 126 to the combiner 160, where the to-be-processed signal includes a receive signal component and a self-interference signal component, the receive signal component corresponds to the receive signal, and the self-interference signal component corresponds to an interference signal generated due to that the antenna 130 reflects the first transmit signal.

The second circulator 140 is configured to: transmit the second transmit signal through the second port 144 to the equivalent load 150, and acquire, through the third port 146, a reference signal generated due to that the equivalent load 150 reflects the second transmit signal, where the impedance of the equivalent load 150 corresponds to the impedance of the antenna 130.

The combiner 160 is configured to cancel the self-interference signal component in the to-be-processed signal according to the reference signal.

The following separately describes in detail connection relationships, structures, and functions of devices.

A. Splitter 110

Specifically, in this embodiment of the present invention, for example, a coupler or a power divider may be used as the splitter 110.

In addition, for example, a signal processed by using a transmit digital signal processing module, a digital-to-analog conversion module, an up-conversion module, and a power amplification module may be used as a to-be-transmitted signal, and input to the splitter 110.

Therefore, the to-be transmitted signal can be divided into two signals by using the splitter 110, where one signal serves as the first transmit signal and is transmitted through the first output end 112 of the splitter 110 to the first port 122 of the first circulator 120, and the other signal serves as the second transmit signal and is transmitted through the second output end 114 of the splitter 110 to the first port 142 of the second circulator 140.

It should be noted that, in this embodiment of the present invention, power of the foregoing first transmit signal and power of the foregoing second transmit signal may be the same or may be different, which is not particularly limited in the present invention.

The coupler and the power divider are used as the splitter 110, so that waveforms of the first transmit signal and the second transmit signal that are output by the splitter 110 can be consistent, which accordingly can improve similarity between a self-interference signal component that is in the aftermentioned to-be-processed signal and is generated due to reflection by an antenna, and a reference signal generated due to reflection by the equivalent load, and further, helps cancel the self-interference signal component based on the reference signal later.

It should be understood that the above enumerated coupler and power divider that are used as the splitter 110 are merely exemplary, and the present invention is not limited thereto. Another apparatus that can make similarity between a waveform of the first transmit signal and a waveform of the second transmit signal be within a preset range falls within the protection scope of the present invention.

In this embodiment of the present invention, the splitter 110 may be a 0° splitter or may be a 180° splitter, which is not particularly limited in the present invention, where phases of two signals generated by splitting processing performed by the 0° splitter are the same, and the 0° splitter may be implemented by a radio-frequency microwave device, such as an in-phase power divider (Power Splitter).

In addition, phases of two signals generated by splitting processing performed by the 180° splitter are opposite, or in other words, a difference between the phases is 180°, and the 180° splitter may be implemented by a radio-frequency microwave device, such as an in-phase power divider (Power Splitter), a 180° bridge (Hybrid), or a single-ended input to double-ended differential output balun.

Configurations and processing processes of the apparatus 100 in the foregoing two cases of the splitter are subsequently described in detail.

It should be noted that in this embodiment of the present invention, a process in which the transmit digital signal processing module, the digital-to-analogue conversion module, the up-conversion module, and the power amplification module process a signal may be similar to that in the prior art, and to avoid repeated description, description of the process is omitted herein.

B. First Circulator 120

Specifically, as shown in FIG. 2, the first circulator includes three ports: the first port 122, the second port 124, and the third port 126.

Under an ideal condition, a signal of the first port 122 may directly enter the second port 124, and a signal of the second port 124 may directly enter the third port 126; however, the first port 122 is isolated from the third port 126, that is, the signal of the first port 122 cannot directly enter the third port 126.

As described above, the first port 122 is connected to the first output port 112 of the splitter 110, the second port 124 is connected to the antenna 130, and the third port 126 is connected to the first input port 162 of the combiner 160.

Therefore, the first transmit signal enters the first circulator 120 through the first output port 112, and is transmitted through the second port 124 to the antenna 130, and then is transmitted through the antenna 130 to external space.

In addition, a receive signal received by the antenna 130 enters the first circulator 120 through the second port 124, and is output through the third port 126 to the first input port 162 of the combiner 160.

In addition, due to a reflection effect of the antenna 130, a part of a signal transmitted by the antenna 130 is reflected back to the second port 124 by the antenna 130, so that a reflection self-interference signal component (hereinafter referred to as self-interference signal component) in a self-interference signal is formed. The self-interference signal component and the foregoing receive signal constitute the to-be-processed signal output through the third port 126 to the first input port 162 of the combiner 160.

It should be noted that, in this embodiment of the present invention, a process in which the antenna 130 receives and transmits a signal may be similar to that in the prior art, and to avoid repeated description, description of the process is omitted herein.

C. Second Circulator 140

Specifically, as shown in FIG. 2, the second circulator includes three ports, that is, the first port 142, the second port 144, and the third port 146.

Under an ideal condition, a signal of the first port 142 may directly enter the second port 144, and a signal of the second port 144 may directly enter the third port 146; however, the first port 142 is isolated from the third port 146, that is, the signal of the first port 142 cannot directly enter the third port 146.

As described above, the first port 142 is connected to the first output port 114 of the splitter 110, the second port 144 is connected to the antenna 130, and the third port 146 is connected to the first input port 162 of the combiner 160.

Therefore, the second transmit signal enters the second circulator 140 through the first output port 114, and is transmitted through the second port 144 to the equivalent load 150.

It should be noted that, to effectively improve the self-interference signal component generated due to reflection by the antenna, as an example instead of a limitation, in this embodiment of the present invention, standard components of a same model may be used for the first circulator 120 and the second circulator 140, so as to improve correlation between the self-interference signal component generated due to reflection by the antenna, and the reference signal generated due to reflection by the equivalent load.

In this embodiment of the present invention, as an example instead of a limitation, the equivalent load 150 may include the following one or more components: lumped parameter components such as a resistor, an inductor, and a capacitor, and distributed parameter components such as a microstrip and a waveguide. In addition, due to a reflection effect of the equivalent load 150, a part of a signal transmitted to the equivalent load 150 is reflected back to the second port 144 by the equivalent load 150, so that a reference signal is formed. The reference is output through the third port 146 to the second input port 164 of the combiner 160.

In addition, in this embodiment of the present invention, to improve an effect of canceling the self-interference signal component in the to-be-processed signal, the impedance of the equivalent load 150 needs to correspond to the impedance of the antenna 130. For example, the impedance of the equivalent load 150 may be similar as much as possible to the impedance of the antenna 130. For example, standard components of a same model may be used, and before the standard components are installed and used, the impedance of the equivalent load 150 and the impedance of the antenna 130 may be measured if possible, so as to select impedances whose similarity (or deviation) meet a preset condition, and improve similarity between the reference signal and the self-interference signal component.

Processing of the splitter 110 is returned. The following separately describes a structure and a signal processing process of the apparatus 100 in a case (that is, Case 1) in which the splitter 110 is a 0° splitter and a structure and a signal processing process of the apparatus 100 in a case (that is, Case 2) in which the splitter 110 is a 180° splitter.

Case 1

Optionally, the splitter 110 is configured to perform splitting processing on a radio-frequency signal to acquire a first transmit signal and a second transmit signal, where a phase of the first transmit signal is the same as or approximately the same as a phase of the second transmit signal; and the combiner 160 is specifically configured to: perform phase inversion processing on the reference signal, so that a phase of the reference signal changes by 180°; and combine the reference signal obtained after the phase inversion processing with the to-be-processed signal.

Specifically, in this embodiment of the present invention, when a 0° splitter is used as the splitter 110, the phase of the first transmit signal is the same as or approximately the same as the phase of the second transmit signal (for example, a deviation of the phases is within a preset range), so that a phase of the reflection self-interference signal component (generated due to that the antenna 130 reflects the first transmit signal) is also the same as the phase of the reference signal (generated due to that the equivalent load 150 reflects the second transmit signal). In this case, a 180° combiner may be used as the combiner 160, and phase inversion processing is processed on the reference signal, so that a difference between the phase of the reference signal and the phase of the reflection self-interference signal component is 180° or approximately 180°; afterwards, the reference signal obtained after the phase inversion processing, and the to-be-processed signal are combined (for example, added up), so that the reflection self-interference signal component in the to-be-processed signal can be offset.

It should be noted that "approximately" in this embodiment of the present invention may refer to that similarity between the two is within a preset range, where the preset range may be arbitrarily determined according to actual use and an actual requirement, which is not particularly limited in the present invention. To avoid repeated description, similar description is omitted unless otherwise described.

Optionally, the splitter 110 is configured to perform splitting processing on a radio-frequency signal to acquire a first transmit signal and a second transmit signal, where a phase of the first transmit signal is the same as or approximately the same as a phase of the second transmit signal; and the combiner 160 is specifically configured to: perform phase inversion processing on the to-be-processed signal, so that a phase of the to-be-processed signal changes by 180°; and combine (for example, add up) the to-be-processed signal obtained after the phase inversion processing, and the reference signal.

Specifically, in this embodiment of the present invention, when a 0° splitter is used as the splitter 110, the phase of the first transmit signal is the same as the phase of the second transmit signal, so that the phase of the reflection self-interference signal component (generated due to that the antenna 130 reflects the first transmit signal) is also the same as or approximately the same as the phase of the reference signal (generated due to that the equivalent load 150 reflects the second transmit signal). In this case, a 180° combiner may be used as the combiner 160, and the phase inversion processing is performed on the to-be-processed signal, so that the phase of the reference signal is opposite to or approximately opposite to the phase of the reflection self-interference signal component in the to-be-processed signal; afterwards, the reference signal obtained after the phase inversion processing, and the to-be-processed signal are combined (for example, added up), so that the reflection self-interference signal component in the to-be-processed signal can be offset.

It should be noted that, as an example instead of a limitation, the foregoing 180° combiner may be implemented by a radio-frequency microwave device, such as an inverse-phase power combiner, a 180° bridge (Hybrid), and a double-ended differential input to single-ended output balun.

Optionally, the splitter 110 is configured to perform splitting processing on a radio-frequency signal to acquire a first transmit signal and a second transmit signal, where a phase of the first transmit signal is the same as or approximately the same as a phase of the second transmit signal; and the apparatus further includes:

a phase changer, where the phase changer is disposed between the splitter 110 and the first circulator 120, and is configured to perform phase inversion processing on the first transmit signal, so that the phase of the first transmit signal changes by 180° or approximately changes by 180°; or the phase changer is disposed between the splitter 110 and the second circulator 140, and is configured to perform phase inversion processing on the second transmit signal, so that the phase of the second transmit signal changes by 180° or approximately changes by 180°; or the phase changer is disposed between the first circulator 120 and the combiner 160, and is configured to perform phase inversion processing on the to-be-processed signal, so that a phase of the to-be-processed signal changes by 180° or approximately changes by 180°; or the phase changer is disposed between the second circulator 140 and the combiner 160, and is configured to perform phase inversion processing on the reference signal, so that a phase of the reference signal changes by 180° or approximately changes by 180°; and the combiner 160 is specifically configured to combine the to-be-processed signal with the reference signal.

Specifically, in this embodiment of the present invention, when a 0° splitter is used as the splitter 110, the phase of the first transmit signal is the same as the phase of the second transmit signal, so that the phase of the reflection self-interference signal component (generated due to that the antenna 130 reflects the first transmit signal) is also the same as or approximately the same as the phase of the reference signal (generated due to that the equivalent load 150 reflects the second transmit signal). In this case, the phase changer may be configured in the apparatus 100, and the phase inversion processing is performed on a target signal, so that a phase of the target signal changes by 180° or approximately changes by 180°, where the target signal may be the first transmit signal output from the first output port 112 of the splitter 110, the second transmit signal output from the second output port 114 of the splitter 110, the to-be-processed signal output from the third port 126 of the first circulator 120, or the reference signal output from the third port 146 of the second circulator 140, which is not particularly limited in the present invention. Therefore, a difference between the phase of the reference signal and the phase of the reflection self-interference signal component can be 180° or approximately 180°; afterwards, the reference signal obtained after the phase inversion processing, and the to-be-processed signal are combined (for example, added up), so that the reflection self-interference signal component in the to-be-processed signal can be offset.

Case 2

Optionally, the splitter 110 is configured to perform splitting processing on a radio-frequency signal to acquire a first transmit signal and a second transmit signal, where a difference between a phase of the first transmit signal and a phase of the second transmit signal is 180° or approximately 180°; and the combiner 160 is specifically configured to combine the to-be-processed signal with the reference signal.

Specifically, in this embodiment of the present invention, when a 180° splitter is used as the splitter 110, the difference between the phase of the first transmit signal and the phase of the second transmit signal is 180° or approximately 180°, so that a difference between the phase of the reflection self-interference signal component (generated due to that the antenna 130 reflects the first transmit signal) and the phase of the reference signal (generated due to that the equivalent load 150 reflects the second transmit signal) is also 180° or approximately 180°. In this case, a 0° combiner may be used as the combiner 160, and the reference signal and the to-be-processed signal are combined (for example, added up), so that the reflection self-interference signal component in the to-be-processed signal can be offset.

In this embodiment of the present invention, as an example instead of a limitation, the 0° combiner may be implemented by a radio-frequency microwave device, such as an in-phase power combiner.

Optionally, the apparatus further includes:

an amplitude and phase regulator 170, disposed between the second circulator 140 and the equivalent load 150, and configured to: regulate, based on the to-be-processed signal, an amplitude and the phase of the second transmit signal, so that an amplitude of the reference signal is opposite to or approximately opposite to an amplitude of the self-interference signal component, and the phase of the reference signal is the same as or approximately the same as a phase of the self-interference signal component; or regulating, based on the to-be-processed signal, an amplitude and the phase of the second transmit signal, so that an amplitude of the reference signal is the same as or approximately the same as an amplitude of the self-interference signal component, and a difference between the phase of the reference signal and a phase of the self-interference signal component is 180° or approximately 180°.

Figure 3:
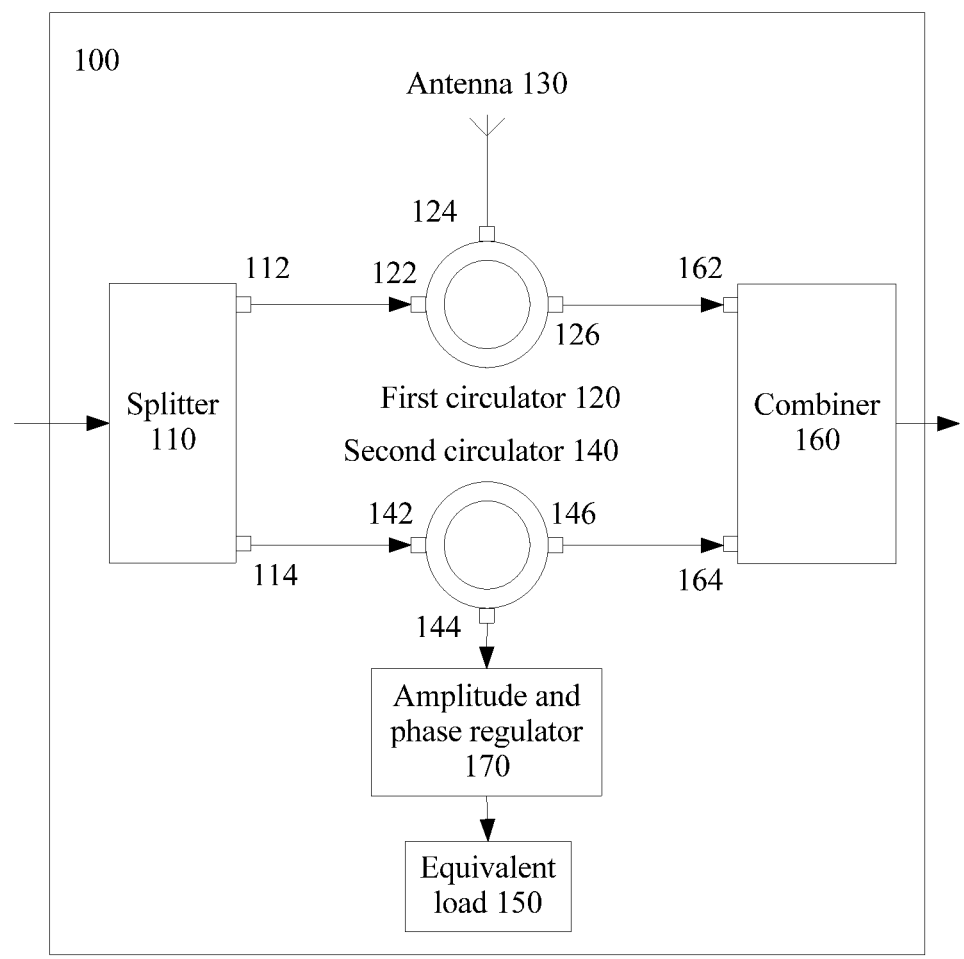
FIG. 3 is a schematic structural diagram of an apparatus for interference cancellation according to another embodiment of the present invention.

Specifically, due to reasons such as production precision, a use environment, and aging, it may be caused that the impedance of the equivalent load 150 cannot match the impedance of the antenna 130, so that an effect of interference cancellation is affected. In this case, as shown in FIG. 3, the amplitude and phase regulator 170 may be disposed in the apparatus 100, and further the amplitude and the phase of the second transmit signal are regulated by using the amplitude and phase regulator 170, so that the reference signal generated due to that the equivalent load 150 reflects the second transmit signal matches the reflection self-interference signal component in the to-be-processed signal, thereby improving the effect of the interference cancellation.

In this embodiment of the present invention, the amplitude and phase regulator 170 may be a regulation circuit that includes a phase regulator and an amplitude regulator connected in series, where the regulation circuit is configured to regulate an amplitude and a phase of a signal in manners such as a phase shift and attenuation. For example, the amplitude of the second transmit signal may be regulated by means of attenuation, and the phase of the second transmit signal may be regulated by means of a phase shift.

As an example instead of a limitation, in this embodiment of the present invention, an attenuator, for example, may be used as the amplitude regulator. A delayer or a phase shifter, for example, may be used as the phase regulator.

Specifically, the second transmit signal is input to the regulation circuit that includes the phase regulator and the amplitude regulator connected in series, where the regulation circuit is configured to regulate an amplitude and a phase of a signal in manners such as a phase shift and attenuation. For example, the amplitude of the second transmit signal may be regulated by means of attenuation, so that an amplitude of the reference signal generated based on the second transmit signal is close to the amplitude of the self-interference signal component in the foregoing to-be-processed signal. Certainly, an optimal effect is that the amplitude of the reference signal is the same as the amplitude of the self-interference signal component. However, because an error exists in an actual application, it is also acceptable that the amplitude of the reference signal is regulated to be approximately the same as the amplitude of the self-interference signal component. In addition, the phase of the second transmit signal may be regulated by means of a phase shift, so that the difference between the phase of the reference signal and the phase of the self-interference signal component is 180° or approximately 180°.

Alternatively, the amplitude of the reference signal may be opposite to the amplitude of the self-interference signal component by using attenuation. Certainly, an optimal effect is that the amplitude of the reference signal is opposite to the amplitude of the foregoing self-interference signal component. However, because an error exists in an actual application, it is also acceptable that the amplitude of the reference signal is regulated to be approximately opposite to the amplitude of the self-interference signal component. In addition, the phase of the reference signal may be the same as or approximately the same as the phase of the self-interference signal component by means of a phase shift.

It should be noted that "approximately" in this embodiment of the present invention may refer to that similarity between the two is within a preset range, where the preset range may be arbitrarily determined according to actual use and an actual requirement, which is not particularly limited in the present invention. To avoid repeated description, similar description is omitted unless otherwise described.

Therefore, the combiner may combine (for example, add up) the to-be-processed signal and the reference signal (generated based on the second transmit signal obtained after the foregoing amplitude and phase regulation), so as to offset the self-interference signal component in the to-be-processed signal, thereby implementing self-interference cancellation processing on the to-be-processed signal.

As an example instead of a limitation, in this embodiment of the present invention, an attenuator, for example, may be used as the amplitude regulator. A delayer or a phase shifter, for example, may be used as the phase regulator.

It should be noted that, in this embodiment of the present invention, the phase shifter and the attenuator may be regulated, based on output from the foregoing combiner, in a manner of minimizing strength of the to-be-processed signal output from the combiner. In addition, the above enumerated manners of regulating the phase shifter and the attenuator are merely exemplary, and the present invention is not limited thereto, provided that the strength of the to-be-processed signal is reduced to achieve an effect of interference cancellation.

In addition, in this embodiment of the present invention, for example, when the amplitude and phase regulator 170 is used together with the foregoing device (for example, the phase changer, the 180° combiner, or the 180° splitter) that can change the phase of the reference signal, "the phase of the reference signal is the same as or approximately the same as a phase of the self-interference signal component" may refer to that the amplitude of the reference signal is the same as or approximately the same as the phase of the self-interference signal component after joint regulation of the amplitude and phase regulator 170 and the foregoing device.

Likewise, "the difference between the phase of the reference signal and the phase of the self-interference signal component is 180° or approximately 180°" may refer to that the difference between the phase of the reference signal and the phase of the self-interference signal component is 180° or approximately 180° after joint regulation of the amplitude and phase regulator 170 and the foregoing device.

According to the apparatus for interference cancellation provided in this embodiment of the present invention, an equivalent load is disposed, so that an impedance of the equivalent load corresponds to an impedance of an antenna; and a reference signal can be obtained by using the equivalent load. In addition, the reference signal corresponds to a self-interference signal generated due to reflection by the antenna, so that a self-interference signal component that is in a receive signal and is generated due to reflection by the antenna can be effectively eliminated by using the reference signal, and an effect of interference cancellation can be improved.

The apparatus for interference cancellation in this embodiment of the present invention is described in detail with reference to FIG. 1 to FIG. 3 in the foregoing, and the following describes in detail, with reference to FIG. 4, a method for interference cancellation according to an embodiment of the present invention.

Figure 4:
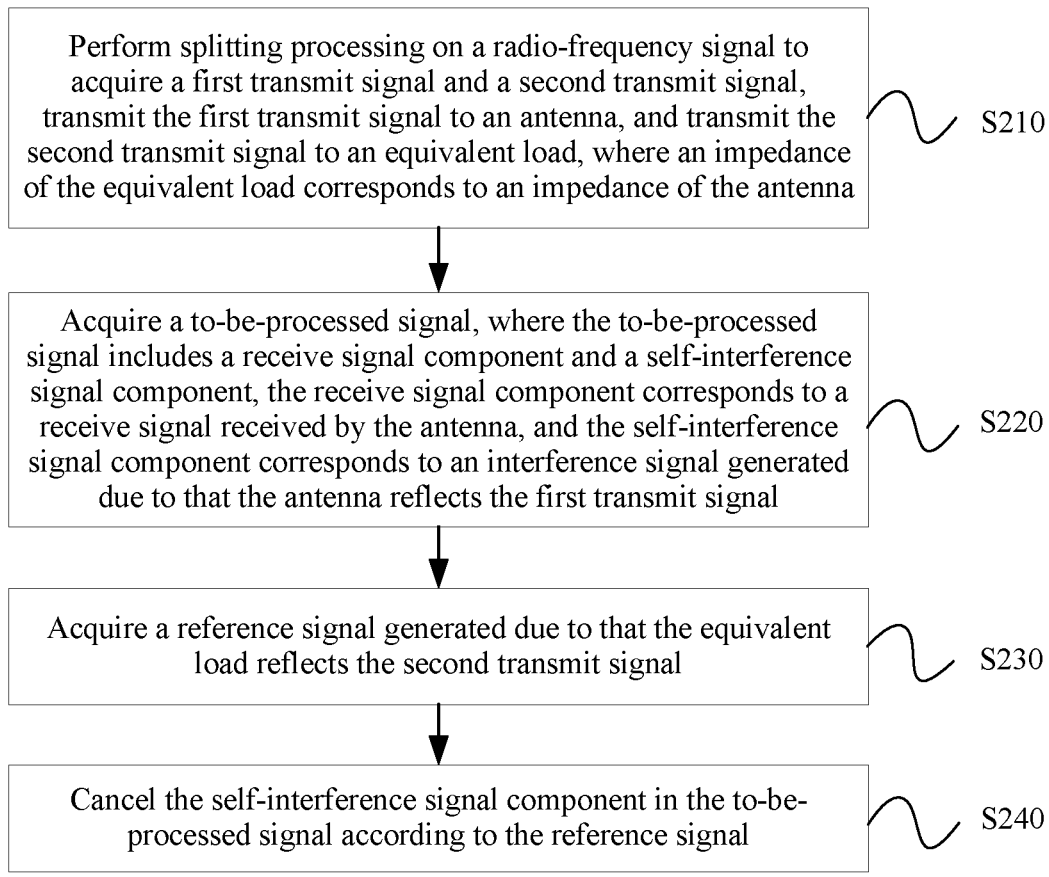
FIG. 4 is a schematic flowchart of a method for interference cancellation according to an embodiment of the present invention.

FIG. 4 shows a schematic flowchart of a method 200 for interference cancellation according to an embodiment of the present invention. As shown in FIG. 4, the method 200 includes the following steps:

S210. Perform splitting processing on a radio-frequency signal to acquire a first transmit signal and a second transmit signal, transmit the first transmit signal to an antenna, and transmit the second transmit signal to an equivalent load, where an impedance of the equivalent load corresponds to an impedance of the antenna.

S220. Acquire a to-be-processed signal, where the to-be-processed signal includes a receive signal component and a self-interference signal component, the receive signal component corresponds to a receive signal received by the antenna, and the self-interference signal component corresponds to an interference signal generated due to that the antenna reflects the first transmit signal.

S230. Acquire a reference signal generated due to that the equivalent load reflects the second transmit signal.

S240. Cancel the self-interference signal component in the to-be-processed signal according to the reference signal.

Specifically, in this embodiment of the present invention, a coupler or a power divider, for example, may be used to split a signal processed, for example, by a digital signal processing module, a digital-to-analog conversion module, an up-conversion module, and a power amplification module into two signals, where one signal serves as the first transmit signal, and the other signal serves as the second transmit signal.

It should be noted that, in this embodiment of the present invention, power of the foregoing first transmit signal and power of the foregoing second transmit signal may be the same or may be different, which is not particularly limited in the present invention.

In addition, a waveform of the first transmit signal can be consistent with a waveform of the second transmit signal by using the coupler or the power divider, which accordingly can improve similarity between a self-interference signal component that is in the aftermentioned to-be-processed signal and is generated due to reflection by an antenna, and a reference signal generated due to reflection by an equivalent load, and further helps cancel the self-interference signal component based on the reference signal later.

It should be understood that the above enumerated method for generating the first transmit signal and the second transmit signal by using the coupler and the power divider is merely exemplary, and the present invention is not limited hereto. Another apparatus that can make similarity between a waveform of the first transmit signal and a waveform of the second transmit signal be within a preset range falls within the protection scope of the present invention.

In addition, in this embodiment of the present invention, a phase of the first transmit signal may be the same as or may be opposite to a phase of the second transmit signal, which is not particularly limited in the present invention. Processing in the foregoing two cases is subsequently described in detail.

It should be noted that in this embodiment of the present invention, a process in which the transmit digital signal processing module, the digital-to-analogue conversion module, the up-conversion module, and the power amplification module process a signal may be similar to that in the prior art, and to avoid repeated description, description of the process is omitted herein.

In this embodiment of the present invention, receiving and transmitting of a signal are performed by a same antenna, and a receive signal and a transmit signal are isolated by using a circulator.

Generally, the circulator includes three ports: a first port, a second port, a third port.

Under an ideal condition, a signal of the first port may directly enter the second port, and a signal of the second port may directly enter the third port; however, the first port is isolated from the third port, that is, the signal of the first port cannot directly enter the third port.

As described above, the first port is configured to acquire the first transmit signal, the second port is connected to the antenna, and the third port is connected to an apparatus for subsequently processing a receive signal.

Therefore, the first transmit signal is transmitted through a second port of a circulator A to the antenna, and then is transmitted through the antenna to external space.

In addition, a receive signal received by the antenna is acquired through a third port of the circulator A.

In addition, due to a reflection effect of the antenna, a part of a signal transmitted by the antenna is reflected back to the second port of the circulator A by the antenna, so that a reflection self-interference signal component (hereinafter referred to as self-interference signal component) in a self-interference signal is formed, and the self-interference signal component and the foregoing receive signal constitute a to-be-processed signal that is output through the third port and that is of an apparatus for subsequently processing a receive signal.

It should be noted that, in this embodiment of the present invention, a process in which the antenna receives and transmits a signal may be similar to that in the prior art, and to avoid repeated description, description of the process is omitted herein.

Similarly, the second transmit signal is transmitted through a second port of another circulator B to an equivalent load.

In addition, due to a reflection effect of the equivalent load, a part of a signal of the second transmit signal is reflected back to the second port of the circulator B by the equivalent load, so that a reference signal is formed.

It should be noted that, to effectively improve the self-interference signal component generated due to reflection by the antenna, as an example instead of a limitation, in this embodiment of the present invention, standard components of a same model may be used for the circulator A and the circulator B, so as to improve correlation between the self-interference signal component generated due to reflection by the antenna, and the reference signal generated due to reflection by the equivalent load.

In this embodiment of the present invention, as an example instead of a limitation, the equivalent load may include the following one or more components: lumped parameter components such as a resistor, an inductor, and a capacitor, and distributed parameter components such as a microstrip and a waveguide.

In addition, in this embodiment of the present invention, to improve an effect of canceling the self-interference signal component in the to-be-processed signal, an impedance of the equivalent load needs to correspond to an impedance of the antenna. For example, the impedance of the equivalent load may be made similar as much as possible to the impedance of the antenna, so as to improve similarity between the reference signal and the self-interference signal component.

The following describes processing when a phase of the first transmit signal is the same as a phase of the second transmit signal.

Optionally, a phase of the first transmit signal is the same as or approximately the same as a phase of the second transmit signal; and the canceling the self-interference signal component in the to-be-processed signal according to the reference signal includes:

performing phase inversion processing on the reference signal, so that a phase of the reference signal changes by 180° or approximately changes by 180°, and combining the reference signal obtained after the phase inversion processing with the to-be-processed signal; or performing phase inversion processing on the to-be-processed signal, so that a phase of the to-be-processed signal changes by 180° or approximately changes by 180°, and combining the to-be-processed signal obtained after the phase inversion processing with the reference signal.

Specifically, in this embodiment of the present invention, when the phase of the first transmit signal is the same as the phase of the second transmit signal, a phase of the reflection self-interference signal component (generated due to that the antenna reflects the first transmit signal) is also the same as the phase of the reference signal (generated due to that the equivalent load reflects the second transmit signal). In this case:

phase inversion processing may be performed on the reference signal, so that the phase of the reference signal is opposite to or approximately opposite to the phase of the reflection self-interference signal component; afterwards, the reference signal obtained after the phase inversion processing, and the to-be-processed signal are combined (for example, added up), so that the reflection self-interference signal component in the to-be-processed signal can be offset; or phase inversion processing may be performed on the to-be-processed signal, so that the phase of the reference signal is opposite to or approximately opposite to the phase of the reflection self-interference signal component in the to-be-processed signal; afterwards, the reference signal obtained after the phase inversion processing, and the to-be-processed signal are combined (for example, added up), so that the reflection self-interference signal component in the to-be-processed signal can be offset.

Optionally, a phase of the first transmit signal is the same as or approximately the same as a phase of the second transmit signal; and the canceling the self-interference signal component in the to-be-processed signal according to the reference signal includes:

performing phase inversion processing on the first transmit signal, so that the phase of the first transmit signal changes by 180° or approximately changes by 180°, and combining the to-be-processed signal with the reference signal; or performing phase inversion processing on the second transmit signal, so that the phase of the second transmit signal changes by 180° or approximately changes by 180°, and combining the to-be-processed signal with the reference signal.

Specifically, in this embodiment of the present invention, when the phase of the first transmit signal is the same as the phase of the second transmit signal, a phase of the reflection self-interference signal component (generated due to that the antenna reflects the first transmit signal) is also the same as the phase of the reference signal (generated due to that the equivalent load reflects the second transmit signal). In this case, phase inversion processing may be performed on the first transmit signal or the second transmit signal, so that the phase of the first transmit signal or the phase of the second transmit signal changes by 180° or approximately changes by 180°, and the phase of the reflection self-interference signal component is opposite to or approximately opposite to the phase of the reference signal; afterwards, the reference signal obtained after the phase inversion processing, and the to-be-processed signal are combined (for example, added up), so that the reflection self-interference signal component in the to-be-processed signal can be offset.

The following describes processing when a phase of the first transmit signal is opposite to a phase of the second transmit signal.

Optionally, a difference between a phase of the first transmit signal and a phase of the second transmit signal is 180° or approximately 180°; and the canceling the self-interference signal component in the to-be-processed signal according to the reference signal includes:

combining the to-be-processed signal with the reference signal.

Specifically, in this embodiment of the present invention, when the difference between the phase of the first transmit signal and the phase of the second transmit signal is 180° or approximately 180°, a difference between a phase of the reflection self-interference signal component (generated due to that the antenna reflects the first transmit signal) and the phase of the reference signal (generated due to that the equivalent load reflects the second transmit signal) is also 180° or approximately 180°. In this case, the reference signal and the to-be-processed signal may be combined (for example, added up), so that the reflection self-interference signal component in the to-be-processed signal can be offset.

In this embodiment of the present invention, as an example instead of a limitation, a 0° combiner may be implemented by a radio-frequency microwave device, such as an in-phase power combiner.

Optionally, the canceling the self-interference signal component in the to-be-processed signal according to the reference signal includes:

regulating, based on the to-be-processed signal, an amplitude and the phase of the second transmit signal, so that an amplitude of the reference signal is opposite to or approximately opposite to an amplitude of the self-interference signal component, and the phase of the reference signal is the same as or approximately the same as a phase of the self-interference signal component; or regulating, based on the to-be-processed signal, an amplitude and the phase of the second transmit signal, so that an amplitude of the reference signal is the same as or approximately the same as an amplitude of the self-interference signal component, and a difference between the phase of the reference signal and a phase of the self-interference signal component is 180° or approximately 180°; and combining the to-be-processed signal with the reference signal.

Specifically, due to reasons such as production precision, a use environment, and aging, it may be caused that the impedance of the equivalent load cannot match the impedance of the antenna, so that an effect of interference cancellation is affected. In this case, the amplitude and the phase of the second transmit signal may be regulated, so that the reference signal generated due to that the equivalent load reflects the second transmit signal matches the reflection self-interference signal component in the to-be-processed signal, thereby improving the effect of the interference cancellation.

In this embodiment of the present invention, an amplitude and a phase of a signal may be regulated in manners such as a phase shift and attenuation. For example, the amplitude of the second transmit signal may be regulated by means of attenuation, and the phase of the second transmit signal may be regulated by means of a phase shift.

For example, the phase and the amplitude of the second transmit signal may be regulated in a manner of minimizing strength of a combination of the reference signal and the to-be-processed signal.

The method 200 for interference cancellation according to this embodiment of the present invention may be performed by devices of the apparatus 100 for self-interference cancellation in FIG. 2.

According to the method for interference cancellation provided in this embodiment of the present invention, an equivalent load is disposed, so that an impedance of the equivalent load corresponds to an impedance of an antenna; and a reference signal can be obtained by using this equivalent load. In addition, the reference signal corresponds to a self-interference signal reflected by the antenna, so that a self-interference signal component that is in a receive signal and is generated due to reflection by the antenna can be effectively eliminated by using the reference signal, and an effect of interference cancellation can be improved.

It should be noted that the above enumerates an embodiment in which "add up" is used as "combine"; however, the present invention is not limited hereto. A change may be performed according to regulation or change status of an amplitude and a phase; for example, if an amplitude and a phase of a reference signal are regulated to be the same as those of an interference signal, the reference signal may also offset the interference signal in a manner of "subtracting".

A person of ordinary skill in the art may be aware that, in combination with the examples described in the embodiments disclosed in this specification, units and algorithm steps may be implemented by electronic hardware or a combination of computer software and electronic hardware. Whether the functions are performed by hardware or software depends on particular applications and design constraint conditions of the technical solutions. A person skilled in the art may use different methods to implement the described functions for each particular application, but it should not be considered that the implementation goes beyond the scope of the present invention.

It may be clearly understood by a person skilled in the art that, for the purpose of convenient and brief description, for a detailed working process of the foregoing system, apparatus, and unit, reference may be made to a corresponding process in the foregoing method embodiments, and details are not described herein again.

It should be understood that sequence numbers of the foregoing processes do not mean execution sequences in various embodiments of the present invention. The execution sequences of the processes should be determined according to functions and internal logic of the processes, and should not be construed as any limitation on the implementation processes of the embodiments of the present invention.

In the several embodiments provided in the present application, it should be understood that the disclosed apparatus may be implemented in other manners. For example, the described apparatus embodiment is merely exemplary. For example, the unit division is merely logical function division and may be other division in actual implementation. For example, a plurality of units or components may be combined or integrated into another system, or some features may be ignored or not performed. In addition, the displayed or discussed mutual couplings or direct couplings or communication connections may be implemented by using some interfaces. The indirect couplings or communication connections between the apparatuses or units may be implemented in electronic, mechanical, or other forms.

The units described as separate parts may or may not be physically separate, and parts displayed as units may or may not be physical units, may be located in one position, or may be distributed on a plurality of network units. Some or all of the units may be selected according to actual needs to achieve the objectives of the solutions of the embodiments.

In addition, functional units in the embodiments of the present invention may be integrated into one processing unit, or each of the units may exist alone physically, or two or more units are integrated into one unit.

When the functions are implemented in the form of a software functional unit and sold or used as an independent product, the functions may be stored in a computer-readable storage medium. Based on such an understanding, the technical solutions of the present invention essentially, or the part contributing to the prior art, or some of the technical solutions may be implemented in a form of a software product. The computer software product is stored in a storage medium, and includes several instructions for instructing a computer device (which may be a personal computer, a server, or a network device) to perform all or some of the steps of the methods described in the embodiments of the present invention. The foregoing storage medium includes: any medium that can store program code, such as a USB flash drive, a removable hard disk, a read-only memory (ROM), a random access memory (RAM), a magnetic disk, or an optical disc.

The foregoing descriptions are merely specific implementation manners of the present invention, but are not intended to limit the protection scope of the present invention. Any variation or replacement readily figured out by a person skilled in the art within the technical scope disclosed in the present invention shall fall within the protection scope of the present invention. Therefore, the protection scope of the present invention shall be subject to the protection scope of the claims.

What is claimed is:

1. An apparatus for self-interference cancellation, wherein the apparatus comprises:

a splitter, configured to: perform splitting processing on a radio-frequency signal to acquire a first transmit signal and a second transmit signal, transmit the first transmit signal to a first port of a first circulator, and transmit the second transmit signal to a first port of a second circulator;

the first circulator, configured to transmit the first transmit signal to an antenna through a second port;

the antenna, configured to: transmit the first transmit signal, perform receiving processing to acquire a receive signal, and transmit the receive signal to the second port of the first circulator, wherein:

the first circulator is further configured to send a to-be-processed signal through a third port to a combiner, wherein the to-be-processed signal comprises a receive signal component and a self-interference signal component, the receive signal component corresponds to the receive signal, and the self-interference signal component corresponds to an interference signal generated due to that the antenna reflects the first transmit signal;

the second circulator, configured to: transmit the second transmit signal through a second port to an equivalent load, and acquire, through a third port, a reference signal generated due to that the equivalent load reflects the second transmit signal, wherein an impedance of the equivalent load corresponds to an impedance of the antenna; and the combiner, configured to cancel the self-interference signal component in the to-be-processed signal according to the reference signal; and the apparatus further comprising:

an amplitude and phase regulator, disposed between the second circulator and the equivalent load, and configured to:

regulate, based on the to-be-processed signal, an amplitude and the phase of the second transmit signal, so that an amplitude of the reference signal is opposite to or approximately opposite to an amplitude of the self-interference signal component, and the phase of the reference signal is the same as or approximately the same as a phase of the self-interference signal component; or regulate, based on the to-be-processed signal, an amplitude and the phase of the second transmit signal, so that an amplitude of the reference signal is the same as or approximately the same as an amplitude of the self-interference signal component, and a difference between the phase of the reference signal and a phase of the self-interference signal component is 180° or approximately 180°; and the combiner is configured to combine the to-be-processed signal with the reference signal.

2. The apparatus according to claim 1, wherein a phase of the first transmit signal is the same as or approximately the same as a phase of the second transmit signal; and the combiner is configured to: perform phase inversion processing on the reference signal, so that a phase of the reference signal changes by 180° or approximately changes by 180°; and combine the reference signal obtained after the phase inversion processing with the to-be-processed signal; or the combiner is configured to: perform phase inversion processing on the to-be-processed signal, so that a phase of the to-be-processed signal changes by 180° or approximately changes by 180°; and combine the to-be-processed signal obtained after the phase inversion processing with the reference signal.

3. The apparatus according to claim 1, wherein a difference between a phase of the first transmit signal and a phase of the second transmit signal is 180° or approximately 180°; and the combiner is configured to combine the to-be-processed signal with the reference signal.

4. An apparatus for self-interference cancellation, wherein the apparatus comprises:

a splitter, configured to: perform splitting processing on a radio-frequency signal to acquire a first transmit signal and a second transmit signal, transmit the first transmit signal to a first port of a first circulator, and transmit the second transmit signal to a first port of a second circulator;

the first circulator, configured to transmit the first transmit signal to an antenna through a second port;

the antenna, configured to: transmit the first transmit signal, perform receiving processing to acquire a receive signal, and transmit the receive signal to the second port of the first circulator, wherein:

the first circulator is further configured to send a to-be-processed signal through a third port to a combiner, wherein the to-be-processed signal comprises a receive signal component and a self-interference signal component, the receive signal component corresponds to the receive signal, and the self-interference signal component corresponds to an interference signal generated due to that the antenna reflects the first transmit signal;

the second circulator, configured to: transmit the second transmit signal through a second port to an equivalent load, and acquire, through a third port, a reference signal generated due to that the equivalent load reflects the second transmit signal, wherein an impedance of the equivalent load corresponds to an impedance of the antenna; and the combiner, configured to cancel the self-interference signal component in the to-be-processed signal according to the reference signal, wherein the splitter is configured to perform splitting processing on a radio-frequency signal to acquire a first transmit signal and a second transmit signal, wherein a phase of the first transmit signal is the same as or approximately the same as a phase of the second transmit signal; and the apparatus further comprises:

a phase changer, wherein the phase changer is disposed between the splitter and the first circulator, and is configured to perform phase inversion processing on the first transmit signal, so that the phase of the first transmit signal changes by 180° or approximately changes by 180°; or the phase changer is disposed between the splitter and the second circulator, and is configured to perform phase inversion processing on the second transmit signal, so that the phase of the second transmit signal changes by 180° or approximately changes by 180°; or the phase changer is disposed between the first circulator and the combiner, and is configured to perform phase inversion processing on the to-be-processed signal, so that a phase of the to-be-processed signal changes by 180° or approximately changes by 180°; or the phase changer is disposed between the second circulator and the combiner, and is configured to perform phase inversion processing on the reference signal, so that a phase of the reference signal changes by 180° or approximately changes by 180°; and the combiner is configured to combine the to-be-processed signal with the reference signal.

5. The apparatus according to of claim 4, wherein the apparatus further comprises:
an amplitude and phase regulator, disposed between the second circulator and the equivalent load, and configured to: regulate, based on the to-be-processed signal, an amplitude and the phase of the second transmit signal, so that an amplitude of the reference signal is opposite to or approximately opposite to an amplitude of the self-interference signal component, and the phase of the reference signal is the same as or approximately the same as a phase of the self-interference signal component; or
regulate, based on the to-be-processed signal, an amplitude and the phase of the second transmit signal, so that an amplitude of the reference signal is the same as or approximately the same as an amplitude of the self-interference signal component, and a difference between the phase of the reference signal and a phase of the self-interference signal component is 180° or approximately 180°; and
the combiner is configured to combine the to-be-processed signal with the reference signal.

6. An apparatus for self-interference cancellation, wherein the apparatus comprises:
a splitter, configured to: perform splitting processing on a radio-frequency signal to acquire a first transmit signal and a second transmit signal, transmit the first transmit signal to a first port of a first circulator, and transmit the second transmit signal to a first port of a second circulator;
the first circulator, configured to transmit the first transmit signal to an antenna through a second port;
the antenna, configured to: transmit the first transmit signal, perform receiving processing to acquire a receive signal, and transmit the receive signal to the second port of the first circulator, wherein:
the first circulator is further configured to send a to-be-processed signal through a third port to a combiner, wherein the to-be-processed signal comprises a receive signal component and a self-interference signal component, the receive signal component corresponds to the receive signal, and the self-interference signal component corresponds to an interference signal generated due to that the antenna reflects the first transmit signal;
the second circulator, configured to: transmit the second transmit signal through a second port to an equivalent load, and acquire, through a third port, a reference signal generated due to that the equivalent load reflects the second transmit signal, wherein an impedance of the equivalent load corresponds to an impedance of the antenna; and
the combiner, configured to cancel the self-interference signal component in the to-be-processed signal according to the reference signal, wherein the apparatus further comprises:
an amplitude and phase regulator, disposed between the second circulator and the equivalent load, and configured to: regulate, based on the to-be-processed signal, an amplitude and the phase of the second transmit signal, so that an amplitude of the reference signal is opposite to or approximately opposite to an amplitude of the self-interference signal component, and the phase of the reference signal is the same as or approximately the same as a phase of the self-interference signal component; or
regulate, based on the to-be-processed signal, an amplitude and the phase of the second transmit signal, so that an amplitude of the reference signal is the same as or approximately the same as an amplitude of the self-interference signal component, and a difference between the phase of the reference signal and a phase of the self-interference signal component is 180° or approximately 180°; and
the combiner is configured to combine the to-be-processed signal with the reference signal.

7. A method for self-interference cancellation, wherein the method comprises:
performing, by a splitter, splitting processing on a radio-frequency signal to acquire a first transmit signal and a second transmit signal, wherein a phase of the first transmit signal is the same as or approximately the same as a phase of the second transmit signal, transmitting, by a first circulator, the first transmit signal to an antenna, and transmitting, by a second circulator, the second transmit signal to an equivalent load, wherein an impedance of the equivalent load corresponds to an impedance of the antenna;
acquiring, by a combiner, a to-be-processed signal, wherein the to-be-processed signal comprises a receive signal component and a self-interference signal component, the receive signal component corresponds to a receive signal received by the antenna, and the self-interference signal component corresponds to an interference signal generated due to that the antenna reflects the first transmit signal;
acquiring, by the second circulator, a reference signal generated due to that the equivalent load reflects the second transmit signal;
canceling, by the combiner, the self-interference signal component in the to-be-processed signal according to the reference signal;
performing, by a phase changer disposed between the second circulator and the combiner, phase inversion processing on the reference signal, so that a phase of the reference signal changes by 180° or approximately changes by 180°, and combining, by the combiner, the reference signal obtained after the phase inversion processing with the to-be-processed signal; or
performing, by a phase changer disposed between the first circulator and the combiner, phase inversion processing on the to-be-processed signal, so that a phase of the to-be-processed signal changes by 180° or approximately changes by 180°, and combining, by the combiner, the to-be-processed signal obtained after the phase inversion processing with the reference signal; or
performing, by a phase changer disposed between the splitter and the first circulator, phase inversion processing on the first transmit signal, so that the phase of the first transmit signal changes by 180° or approximately changes by 180°, and combining, by the combiner, the to-be-processed signal with the reference signal; or
performing, by a phase changer disposed between the splitter and the second circulator, phase inversion processing on the second transmit signal, so that the phase of the second transmit signal changes by 180° or approximately changes by 180°, and combining, by the combiner, the to-be-processed signal with the reference signal.

8. The method according to claim 7, wherein a difference between a phase of the first transmit signal and a phase of the second transmit signal is 180° or approximately 180°; and
the canceling the self-interference signal component in the to-be-processed signal according to the reference signal comprises:

combining the to-be-processed signal with the reference signal.

9. The method according to claim 8, wherein the canceling the self-interference signal component in the to-be-processed signal according to the reference signal comprises:

regulating, based on the to-be-processed signal, an amplitude and the phase of the second transmit signal, so that an amplitude of the reference signal is opposite to or approximately opposite to an amplitude of the self-interference signal component, and the phase of the reference signal is the same as or approximately the same as a phase of the self-interference signal component; or regulating, based on the to-be-processed signal, an amplitude and the phase of the second transmit signal, so that an amplitude of the reference signal is the same as or approximately the same as an amplitude of the self-interference signal component, and a difference between the phase of the reference signal and a phase of the self-interference signal component is 180° or approximately 180°; and combining the to-be-processed signal with the reference signal.

10. The method according to claim 7, wherein the canceling the self-interference signal component in the to-be-processed signal according to the reference signal comprises:

regulating, based on the to-be-processed signal, an amplitude and the phase of the second transmit signal, so that an amplitude of the reference signal is opposite to or approximately opposite to an amplitude of the self-interference signal component, and the phase of the reference signal is the same as or approximately the same as a phase of the self-interference signal component; or regulating, based on the to-be-processed signal, an amplitude and the phase of the second transmit signal, so that an amplitude of the reference signal is the same as or approximately the same as an amplitude of the self-interference signal component, and a difference between the phase of the reference signal and a phase of the self-interference signal component is 180° or approximately 180°; and combining the to-be-processed signal with the reference signal.

11. The method according to claim 7, wherein the canceling the self-interference signal component in the to-be-processed signal according to the reference signal comprises:

regulating, based on the to-be-processed signal, an amplitude and the phase of the second transmit signal, so that an amplitude of the reference signal is opposite to or approximately opposite to an amplitude of the self-interference signal component, and the phase of the reference signal is the same as or approximately the same as a phase of the self-interference signal component; or regulating, based on the to-be-processed signal, an amplitude and the phase of the second transmit signal, so that an amplitude of the reference signal is the same as or approximately the same as an amplitude of the self-interference signal component, and a difference between the phase of the reference signal and a phase of the self-interference signal component is 180° or approximately 180°; and combining the to-be-processed signal with the reference signal.

12. The method according to claim 7, wherein the canceling the self-interference signal component in the to-be-processed signal according to the reference signal comprises:

regulating, based on the to-be-processed signal, an amplitude and the phase of the second transmit signal, so that an amplitude of the reference signal is opposite to or approximately opposite to an amplitude of the self-interference signal component, and the phase of the reference signal is the same as or approximately the same as a phase of the self-interference signal component; or regulating, based on the to-be-processed signal, an amplitude and the phase of the second transmit signal, so that an amplitude of the reference signal is the same as or approximately the same as an amplitude of the self-interference signal component, and a difference between the phase of the reference signal and a phase of the self-interference signal component is 180° or approximately 180°; and combining the to-be-processed signal with the reference signal.

\* \* \* \* \*